United States Patent
Sporer et al.

(10) Patent No.: US 10,056,381 B2
(45) Date of Patent: Aug. 21, 2018

(54) PUNCHTHROUGH STOP LAYERS FOR FIN-TYPE FIELD-EFFECT TRANSISTORS

(71) Applicant: GLOBALFOUNDRIES Inc., Grand Cayman (KY)

(72) Inventors: Ryan Sporer, Mechanicville, NY (US); Amy Child, Wilton, NY (US); George Mulfinger, Wilton, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/259,268

(22) Filed: Sep. 8, 2016

(65) Prior Publication Data

US 2018/0069005 A1   Mar. 8, 2018

(51) Int. Cl.
| | |
|---|---|
| H01L 27/092 | (2006.01) |
| H01L 21/8238 | (2006.01) |
| H01L 29/10 | (2006.01) |
| H01L 21/225 | (2006.01) |
| H01L 21/308 | (2006.01) |
| H01L 21/324 | (2006.01) |
| H01L 29/167 | (2006.01) |

(52) U.S. Cl.
CPC ...... *H01L 27/0924* (2013.01); *H01L 21/2256* (2013.01); *H01L 21/308* (2013.01); *H01L 21/324* (2013.01); *H01L 21/823821* (2013.01); *H01L 29/1083* (2013.01); *H01L 29/167* (2013.01)

(58) Field of Classification Search
CPC ......... H01L 27/0924; H01L 21/823821; H01L 27/1203; H01L 27/1211; H01L 21/84; H01L 21/845; H01L 21/823878; H01L 21/823807
See application file for complete search history.

(56) References Cited

U.S. PATENT DOCUMENTS

| | | | |
|---|---|---|---|
| 9,379,243 B1 * | 6/2016 | Hashemi | H01L 29/7849 |
| 9,514,995 B1 * | 12/2016 | Fogel | H01L 21/823878 |
| 2013/0115763 A1 | 5/2013 | Takamure et al. | |
| 2015/0372139 A1 | 12/2015 | Wei et al. | |
| 2016/0013273 A1 | 1/2016 | Zhang et al. | |
| 2017/0256542 A1 * | 9/2017 | Leobandung | H01L 27/0921 |

* cited by examiner

*Primary Examiner* — Jose R Diaz
(74) *Attorney, Agent, or Firm* — Thompson Hine LLP; Francois Pagette

(57) ABSTRACT

Device structures for a FinFET and fabrication methods for making a device structure for a FinFET. A first layer containing a first dopant is formed on a first region of a substrate. A second layer containing a second dopant is formed on a second region of the substrate. A first plurality of fins are formed and are each located in a respective trench extending from the substrate through the first layer. A second plurality of fins are formed and are each located in a respective trench extending from the substrate through the second layer. The first dopant is transferred from the first layer to a first section in each of the first plurality of fins and the second dopant is transferred from the second layer to a first section in each of the second plurality of fins.

20 Claims, 4 Drawing Sheets

PUNCHTHROUGH STOP LAYERS FOR FIN-TYPE FIELD-EFFECT TRANSISTORS

BACKGROUND

The present invention relates to semiconductor device fabrication and integrated circuits and, more specifically, to device structures for a fin-type field-effect transistor (Fin-FET) and methods for fabricating a device structure for a FinFET.

A FinFET is a non-planar device structure that is capable of being more densely packed in an integrated circuit than planar field-effect transistors. In addition to the increase in packing density, FinFETs also offer superior short channel scalability, reduced threshold voltage swing, higher mobility, and the ability to operate at lower supply voltages than traditional planar field-effect transistors. A FinFET includes one or more fins of semiconductor material and an overlapping gate electrode that intersects a channel of the one or more fins. The fin dimensions determine the effective channel width of the FinFET. Heavily-doped source/drain regions are formed in fin sections that are not covered by the gate electrode. The channel is located in each fin between these heavily-doped source/drain regions.

A super steep retrograde well (SSRW) may be formed below each fin in an underlying bulk substrate. The SSRW may be employed to improve drain induced barrier lowering (DIBL) and to prevent punchthrough at the bottom of each fin. The SSRW may also mitigate dopant diffusion into the fin, which can result in varying threshold voltage along a fin height and can also result in random dopant fluctuations.

Improved device structures for a FinFET and fabrication methods for making such device structures for a FinFET are needed.

SUMMARY

In an embodiment of the invention, a device structure includes a first layer containing a first dopant on a first region of a substrate, and a second layer containing a second dopant on a second region of the substrate. The device structure further includes a first plurality of fins each extending from the substrate in a respective trench through the first layer, and a second plurality of fins each extending from the substrate in a respective trench through the second layer. Each of the first plurality of fins includes a section in a trench extending through the first layer, and the section includes a concentration of the first dopant. Each of the second plurality of fins includes a section in a trench extending through the second layer, and the second section includes a concentration of the second dopant.

In an embodiment of the invention, a method is provided that includes forming a first layer containing a first dopant on a first region of a substrate, and forming a second layer containing a second dopant on a second region of the substrate. The method further includes forming a first plurality of fins each located in a respective trench extending from the substrate through the first layer, and forming a second plurality of fins each located in a respective trench extending from the substrate through the second layer. The first dopant is transferred from the first layer to a first section in each of the first plurality of fins and the second dopant is transferred from the second layer to a first section in each of the second plurality of fins.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
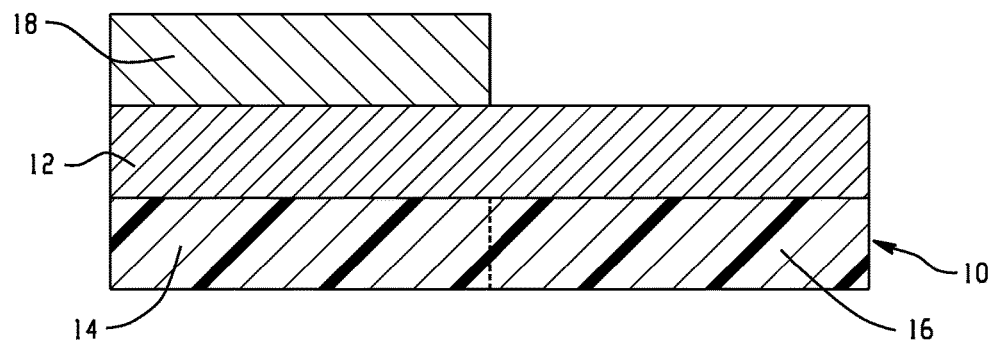
FIGS. 1-8 are cross-sectional views of a portion of a substrate at successive stages of a processing method in accordance with embodiments of the invention.

With reference to FIG. 1 and in accordance with an embodiment of the invention, a layer 12 containing a dopant is formed with a given thickness on a top surface of a substrate 10. The substrate 10 may be a bulk substrate or a device layer of a semiconductor-on-insulator (SOI) substrate, and may include a region 14 designated for the construction of n-type fin-type field-effect transistors (NFETs) and a region 16 designated for the construction of p-type fin-type field-effect transistors (PFETs). Layer 12 may be composed of a material that contains a dopant from Group III of the Periodic Table, and that is an electrical insulator characterized by an electrical resistivity at room temperature of greater than $10^{10}$ ($\Omega$-m). The dopant in layer 24 may provide p-type conductivity in a silicon-based semiconductor material. In an embodiment, the layer 12 may be composed of a boron-containing oxide or a boron-doped silicate glass (BSG) that contains boron (B) as the dopant. The layer 12 may be deposited by, for example, chemical vapor deposition (CVD) or atomic layer deposition (ALD) as a thin film of a given thickness that coats and covers the entire top surface of the substrate 10.

A mask layer 18 is applied to the top surface of the layer 12. The mask layer 18 overlies and covers the region 16 designated for the construction of n-type field-effect transistors (NFETs). The mask layer 18 may be composed of, for example, a photoresist material that is applied by a spin coating process, pre-baked, exposed to a radiation projected through a photomask, baked after exposure, and developed with a chemical developer to define a block mask that covers the section of layer 12 that overlies region 16 of the substrate 10.

Figure 2:
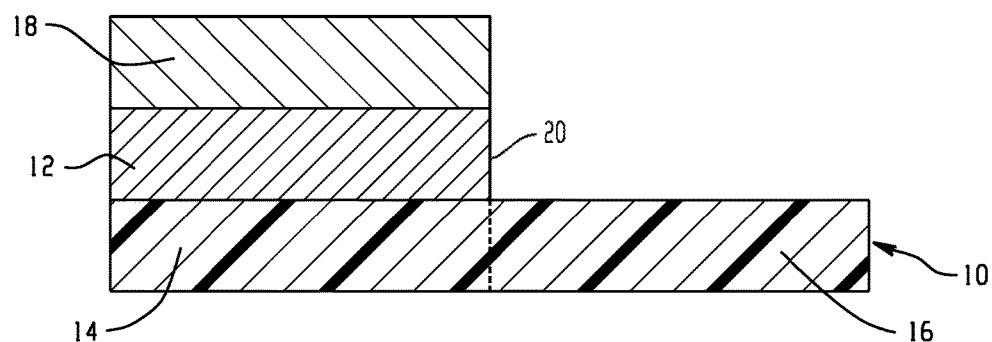

With reference to FIG. 2 in which like reference numerals refer to like features in FIG. 1 and at a subsequent fabrication stage, a section of the layer 12 overlying region 14 of the substrate 10 is removed by etching using a wet chemical or dry etch process, which may rely on an etch chemistry that removes the constituent material of the layer 12 selective to the constituent material of the substrate 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

The mask layer 18 protects a section of the layer 12 overlying the region 16 of the substrate 10 against removal by the etching process. In the representative embodiment, the section of layer 12 overlying region 14 of the substrate 10 is completely removed such that the top surface of the substrate 10 is revealed. The residual section of layer 12 is truncated at an edge 20 at, or near, a vertical interface between the different regions 14, 16 of the substrate 10.

Figure 3:
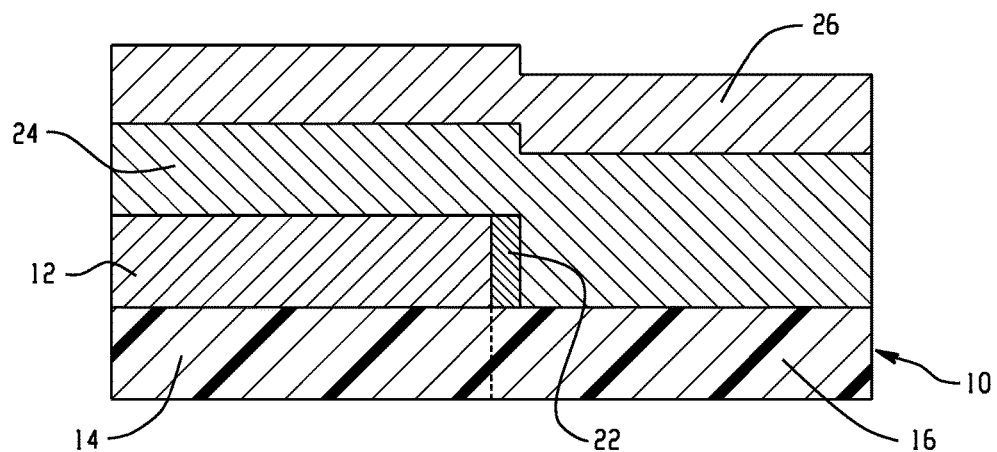

With reference to FIG. 3 in which like reference numerals refer to like features in FIG. 2 and at a subsequent fabrication stage, the mask layer 18 is stripped from the surface of layer 12. A spacer 22 is applied to the edge 20 of the layer 12. The spacer 22 may be formed by depositing a conformal layer comprised of a dielectric material, such as silicon nitride ($Si_3N_4$) deposited by chemical vapor deposition, and shaping the conformal layer with an anisotropic etching process, such as reactive ion etching, that preferentially removes the dielectric material from horizontal surfaces.

A layer 24 containing a dopant is formed with a given thickness on the substrate 10. The layer 24 may be composed of a material that contains a dopant from Group V of the Periodic Table, and that is an electrical insulator characterized by an electrical resistivity at room temperature of greater than $10^{10}$ (Ω-m). The dopant in layer 24 may provide n-type conductivity in a silicon-based semiconductor material. In an embodiment, the layer 24 may be composed of a phosphorus-containing oxide or a phosphorus-doped silicate glass (PSG) that contains phosphorus (P) as the dopant. In an alternative embodiment, the layer 24 may be composed of an arsenic-containing oxide or an arsenic-doped silicate glass (ASG) that contains a different dopant from Group V of the Periodic Table (i.e., arsenic (As)). Layer 24 may be deposited by, for example, CVD or ALD as a thin film of a given thickness that coats and covers the entire top surface of the substrate 10. In particular, the deposited layer 24 coats and covers both regions 14, 16 of the substrate 10 with a topography at its top surface that adopts the unevenness resulting from the patterned layer 12 being located only on region 14 of the substrate 10. The spacer 22 is located between layer 12 and layer 24. Specifically, a deposited layer 24 includes a step located generally at the position of the spacer 22.

A sacrificial dielectric layer 26 is deposited with a given thickness on the substrate 10 and covers the layer 24. The sacrificial dielectric layer 26 may be comprised of an oxide of silicon (e.g., silicon dioxide) deposited by CVD using, for example, ozone and tetraethylorthosilicate (TEOS) as reactant gases. The sacrificial dielectric layer 26 also coats and covers both regions 14, 16 of the substrate 10 with a topography that adopts the unevenness resulting from the patterned layer 12 being located only on region 14.

Figure 4:
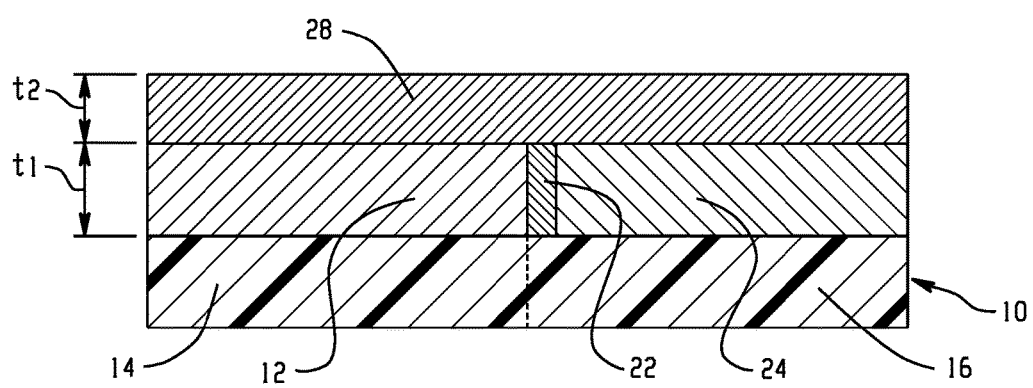

With reference to FIG. 4 in which like reference numerals refer to like features in FIG. 3 and at a subsequent fabrication stage, the layers 12, 24 containing different dopants are planarized relative to each other to provide flat top surface. The planarization process, which removes the sacrificial dielectric layer 26, may rely on a chemical mechanical polishing (CMP) process that may be conducted with a commercial tool using a polishing pad and slurry selected to polish the targeted material. The planarization may be promoted by the similarity between the materials of layers 12, 24 and the material of the sacrificial dielectric layer 26. Following planarization, the layers 12, 24 may have a given common thickness, t1. The planarization results in a juxtaposed arrangement between the layers 12, 24 with the spacer 22 located between layer 12 and layer 24.

A dielectric layer 28 is formed with a given thickness, t2, on the planarized top surface of the co-planar layers 12, 24. The dielectric layer 28 may be comprised of an electrical insulator characterized by an electrical resistivity at room temperature of greater than $10^{10}$ (Ω-m), and that is deposited by CVD. In an embodiment, the dielectric layer 28 may be a high quality and/or high density oxide of silicon, which may be deposited by high-density-plasma chemical vapor deposition (HDP-CVD). The properties of the dielectric layer 28 contrast to the properties of layers 12, 24 in that the dielectric layer 28 does not contain a dopant and is, therefore, undoped in comparison with the layers 12, 24.

Figure 5:
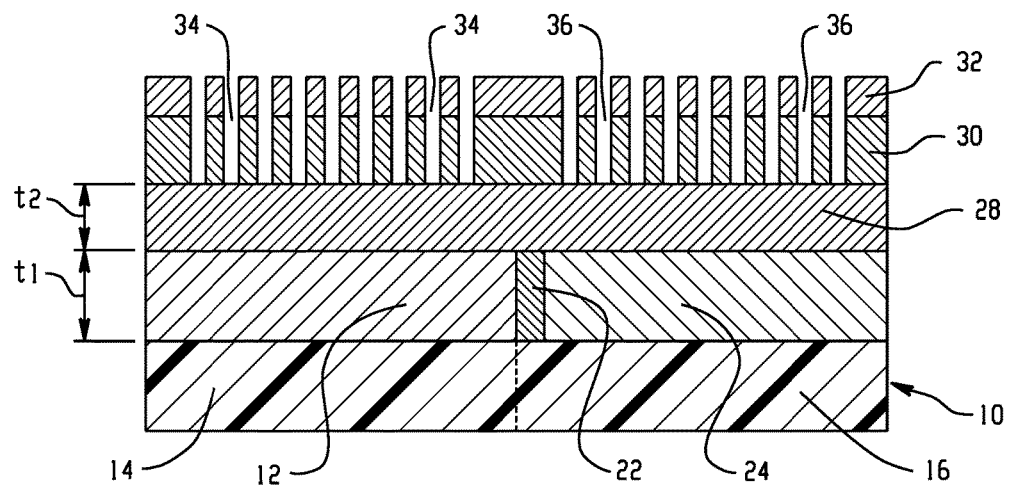

With reference to FIG. 5 in which like reference numerals refer to like features in FIG. 4 and at a subsequent fabrication stage, a multilayer patterning stack that includes a hardmask layer 30 and a hardmask layer 32 are formed on the dielectric layer 28. Hardmask layer 30 may be composed of a dielectric material, such as silicon nitride ($Si_3N_4$) deposited by CVD. Hardmask layer 32 may be composed of a dielectric material, such as silicon dioxide ($SiO_2$) deposited by chemical vapor deposition (CVD).

The hardmask layers 30, 32 are patterned to define a plurality of openings 34 aligned vertically with the region 14 designated for the construction of n-type field-effect transistors (NFETs) and a separate and distinct plurality of openings 36 aligned vertically with the region 16 designated for the construction of p-type field-effect transistors (PFETs). To that end, a photoresist layer may be applied using a spin coating process, pre-baked, exposed to light projected through a photomask, baked after exposure, and developed with a chemical developer to form a pattern that includes openings at the intended locations of the subsequently-formed openings 34, 36. The openings 34, 36 may be formed in the hardmask layers 30, 32 with an etching process conducted in a single etching step with a given etch chemistry or in multiple etching steps with different etch chemistries. The dielectric layer 28 may act as an etch stop if the etching process removes the constituent material of the hardmask layer 30 selective to the material of the dielectric layer 28.

Figure 6:
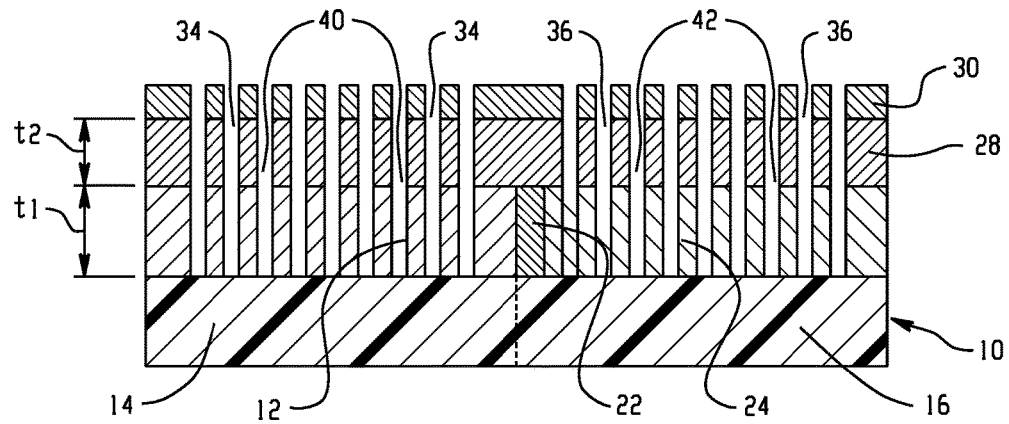

With reference to FIG. 6 in which like reference numerals refer to like features in FIG. 5 and at a subsequent fabrication stage, the hardmask layer 32 may be removed and the hardmask layer 30 patterned with openings 34, 36 remains on the dielectric layer 28. Trenches 40 are formed in the layers 12, 28 overlying the region 14 of the substrate 10 that is designated for the construction of NFETs. Trenches 42 are formed in the layers 24, 28 overlying the region 16 of the substrate 10 that is designated for the construction of PFETs. The trenches 40, 42 are synchronously formed by an etching process, which may be a reactive-ion etching (RIE) process, that removes the materials of layers 12, 24, 28 at the locations of the openings 34, 36 in the hardmask layer 30. The etching process may be conducted in a single etching step with a given etch chemistry or multiple etching steps with different etch chemistries. The semiconductor material of the substrate 10 may act as an etch stop such that the trenches 40, 42 extend through the layers 12, 28 and the layers 24, 28 to the top surface of the substrate 10.

Figure 7:
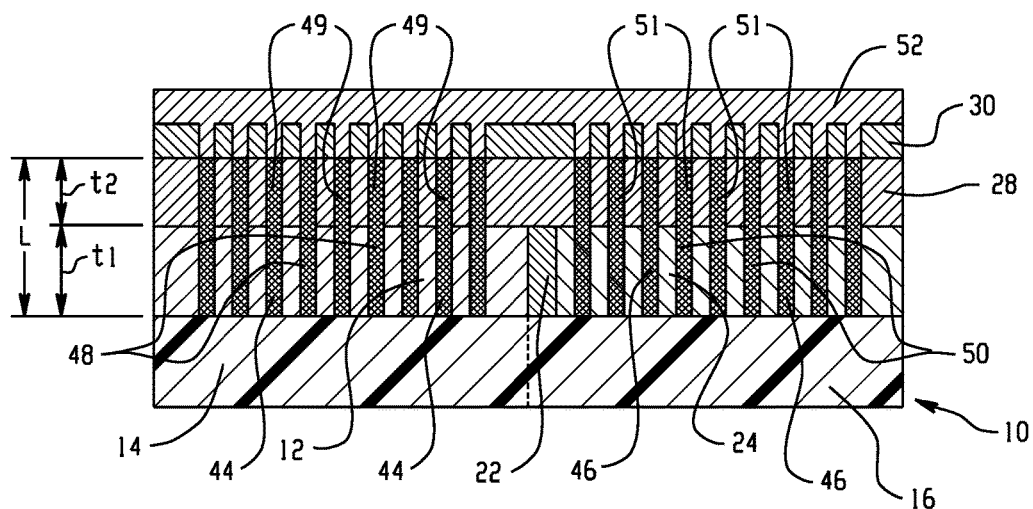

With reference to FIG. 7 in which like reference numerals refer to like features in FIG. 6 and at a subsequent fabrication stage, fins 44 each comprised of a semiconductor body may be formed in trenches 40 and fins 46 of a semiconductor material may be formed in trenches 42. The fins 44, 46 may be synchronously formed using an epitaxial growth process (e.g., LPCVD) to deposit a semiconductor material, such as silicon (Si), silicon germanium (SiGe), or carbon-doped silicon (Si:C), inside the trenches 40, 42. The trenches 40, 42 operate to laterally constrain the lateral dimension of the fins 44, 46 during the epitaxial growth process, and the crystal structure of the semiconductor material of the substrate 10 operates as a template for the crystal structure of the fins 44, 46. In an embodiment, the fins 44, 46 may be formed by a selective epitaxial growth process in which semiconductor material nucleates for epitaxial growth on semiconductor surfaces, such as the portion of the substrate 16 exposed at the base of each of the trenches 40, 42, but does not nucleate for epitaxial growth on insulator surfaces, such as the surface of the hardmask layer 30. The fins 44, 46 are three-dimensional, non-planar bodies of semiconductor material formed on the substrate 10. In the representative embodiment, the fins 46 are epitaxially grown concurrent with the epitaxial growth of fins 44 using the same epitaxial growth process.

The fins 44, which include sections 48, are located in region 14 of the substrate 10 that is designated for the construction of NFETs. The fins 46, which include sections 50, are located in region 16 of the substrate 10 that is designated for the construction of PFETs. The fins 44, 46 have respective bases that are located at the top surface of the substrate 10. The fins 44 project upwardly from the top surface of the substrate 10 to penetrate through layers 12, 28 and may have a top surface located at, or near, the top surface of layer 28. Similarly, the fins 46 project upwardly from the top surface of the substrate 10 to penetrate through layers 24, 28 and may have a top surface located at, or near, the top surface of layer 28. The fins 44, 46 have a height, L, that may be measured in a vertical direction relative to the top surface of the substrate 10.

The height of the fins 44 may be equal to the sum of the thickness, t1, of the layer 12 and the thickness, t2, of the dielectric layer 28. Over a fraction of the height, L, equal to the layer thickness, t1, of the planarized layer 12, sections 48 of the fins 44 are horizontally aligned with, and surrounded by, the material of layer 12. The height of the fins 46 may be equal to the sum of the thickness, t1, of the layers 24 and the thickness, t2, of the dielectric layer 28. Over a fraction of the height, L, equal to the layer thickness, t1, of the planarized layer 24, sections 50 of the fins 46 are horizontally aligned with, and surrounded by, the material of layer 24. Over a fraction of the height equal to the layer thickness, t2, of the dielectric layer 28, the fins 44, 46 in both regions 14, 16 of the substrate 10 are horizontally aligned with, and surrounded by, the material of layer 28.

A dielectric layer 52 is formed with a given thickness on the top surface of the dielectric layer 24. The dielectric layer 52 may be comprised, for example, of silicon dioxide ($SiO_2$) that is deposited by CVD. Portions of the dielectric layer 52 fill the openings 34 in the hardmask layer 30 such that the fins 44 in trenches 40 are capped. Other portions of the dielectric layer 52 fill the openings 36 in the hardmask layer 30 such that the fins 46 in trenches 42 are capped.

Layer 12 is used as a dopant source for doping the respective sections 48 of the fins 44 with a concentration of the dopant contained in the as-deposited layer 12. Similarly, layer 24 is used as a dopant source for doping respective sections 50 of the fins 46 with a concentration of the dopant contained in the as-deposited layer 24. In an embodiment, a thermal anneal at a given temperature and over a given duration may be used to transfer or drive a portion of the dopant of layer 12 by diffusion into the section 48 of each fin 44 and to transfer or drive a portion of the dopant of layer 24 by diffusion into the section 50 of each fin 46. The vertical dimension measured parallel to the height, L, of the sections 48, 50 of the fins 44, 46 receiving the respective dopants may be nominally equal to the thickness, t1, of the layers 12, 24 following planarization. The capping dielectric layer 52 may operate to reduce escape of the dopants into the environment of the substrate 10 during the thermal anneal. The sections 48, 50, which contain the different dopants, are located in respective lower portions of the fins 44, 46 that are adjacent to the top surface of the substrate 10. During the thermal anneal, the spacer 22 located between layer 12 and layer 24 may function as a diffusion barrier to the dopants in the layers 12, 24.

A section 49 of each of the fins 44, which is vertically aligned with the dielectric layer 28, is not doped by dopant originating from layer 12 during the thermal anneal. Similarly, a section 51 of each of the fins 46, which is vertically aligned with the dielectric layer 28, is not doped by dopant originating from layer 24 during the thermal anneal. The vertical dimension measured parallel to the height, L, of the sections 49, 51 of the fins 44, 46 may be nominally equal to the thickness, t2, of the layer 28. Upon completion of the NFET and PFET device structures, sections 49, 51 of the fins 44, 46 may operate as the channels of NFET and PFET device structures and are comprised of semiconductor material that does not receive a dopant from the layers 12, 24. In an embodiment, the sections 49, 51 of the fins 44, 46 may be undoped.

The section 48 in the body of each fin 44 and the section 50 in the body of each fin 46 may operate as punchthrough stop layers that suppress punchthrough leakage through the mechanism of dopant junction isolation. Due to the different dopants in the layers 12, 24, the semiconductor material of sections 48 has an opposite conductivity type than the semiconductor material of the sections 50. The sections 48, 50 may mimic the function of super steep retrograde wells.

Figure 8:
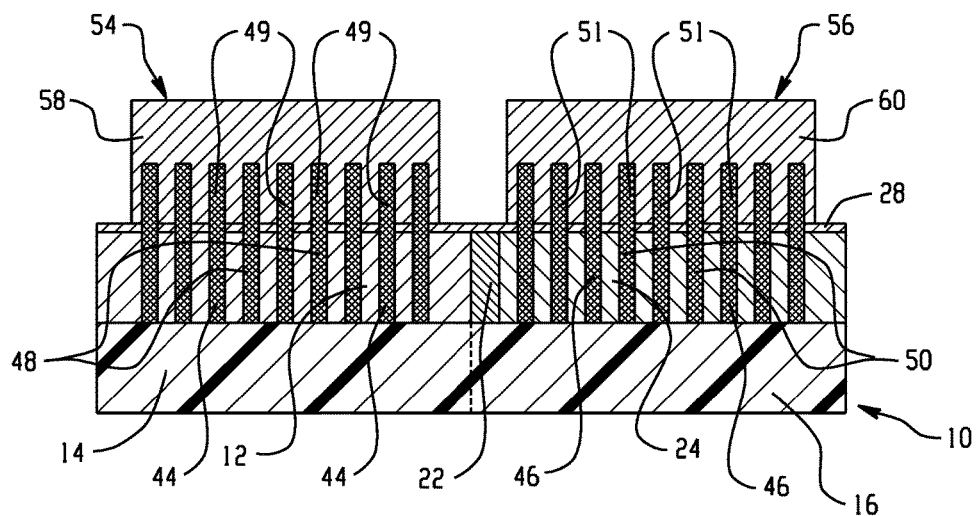

With reference to FIG. 8 in which like reference numerals refer to like features in FIG. 7 and at a subsequent fabrication stage, the capping dielectric layer 52 is removed by a planarization process, such as a chemical mechanical polishing (CMP) process conducted with a commercial tool using a standard polishing pad and slurry selected to polish the targeted material of dielectric layer 52 selective to the material of the hardmask layer 32. The hardmask layer 32 may be removed using an etching process, such as a wet chemical etch or a dry etch, and may rely on a given etch chemistry (e.g., hot phosphoric acid for a wet chemical etch of silicon nitride) that removes the dielectric material of the hardmask layer 32 selective to the dielectric materials constituting the capping dielectric layer 52 and the dielectric layer 28. The portions of the capping dielectric layer 52 residing on the fins 44, 46 may protect the fins 44, 46 during the etching process removing the hardmask layer 32.

The dielectric layer 28 is recessed as part of a reveal process that partially exposes the sections 49, 51 for fins 44, 46 for further processing to respectively form NFETS and PFETS. The respective sections 48, 50 of fins 44, 46 are located below the recessed top surface of the dielectric layer 28. In an embodiment, a wet chemical etching process may be used to recess the dielectric layer 28. If the dielectric layer 28 is comprised of an oxide of silicon, the wet chemical etching process may utilize a wet chemical etchant containing hydrofluoric acid (HF). The wet chemical etching process may also remove the residual caps of the capping dielectric layer 52 from the top surfaces of the fins 44, 46.

Gate structures 54, 56 are subsequently formed in the fabrication process flow. Gate structure 54, which is located above the region 14 designated for the construction of NFETs using fins 44, includes a gate electrode 58 that overlaps the fins 44 and a gate dielectric (not shown) between the gate electrode 58 and the fins 44. Gate structure 56, which is located above region 16 designated for the construction of PFETs using fins 46, includes a gate electrode 60 that overlaps the fins 46 and a gate dielectric (not shown) between the gate electrode 60 and the fins 46. The gate electrodes 58, 60 may be comprised of a metal, such as aluminum or tungsten, deposited by physical vapor deposition (PVD), CVD, etc., and may also include one or more work function metal layers present to adjust the threshold voltage. The gate dielectrics may be comprised of a dielectric or insulating material, such as a high-k dielectric material such as hafnium oxide or hafnium oxynitride, silicon dioxide, silicon oxynitride, or layered combinations of these dielectric materials, deposited by CVD, ALD, etc. Sidewall spacers comprised of a dielectric material, such as SIOCN, are respectively located on the sidewalls of the gate electrodes 58, 60. Caps comprised of a dielectric material, such as SiOCN, are located on the respective top surfaces of the gate structures 54, 56.

In the region 14 designated for the construction of NFETs, a source and a drain (not shown) are formed in sections of each fin 44 that flank the channel of section 49 and that are not covered by the gate structure 54. The semiconductor material of the source and drain may comprise an n-type dopant from Group V of the Periodic Table (e.g., phosphorus (P) or arsenic (As)) that is effective to impart n-type conductivity. The conductivity type of the source and drain is opposite to the conductivity type of the section 48 in the body of each fin 44 that operates as a punchthrough stop layer.

In the region 16 designated for the construction of PFETs, a source and a drain regions (not shown) are formed in sections of each fin 46 that flank the channel of section 51 and that are not covered by the gate structure 56. The semiconductor material of the source and drain may comprise a p-type dopant selected from Group III of the Periodic Table (e.g., boron (B)) that is effective to impart p-type conductivity. The conductivity type of the source and drain is opposite to the conductivity type of the section 50 in the body of each fin 46 that operates as a punchthrough stop layer.

In an alternative embodiment, the substrate 10 may include a strain relaxed buffer (SRB) located beneath the fins and layers 12, 24. The SRB may be composed of a relaxed silicon germanium (SiGe) buffer layer with an amount of strain relative to the germanium content of the alloy. For example, the SRB may comprise a buffer layer of SiGe containing 20% germanium. The strain of the SRB may be transferred as tensile strain to the respective sections 49 of the fins 44 and may operate to enhance carrier mobility in the NFETS.

In an alternative embodiment, the fins 46 associated with the region 16 designated for the construction of PFETs may be composed of a different semiconductor material than the fins 44 that are located in region 14 designated for the construction of NFETs. For example, the fins 46 may be composed of silicon germanium (SiGe) with an amount of strain given by the germanium content of the alloy, which determines the lattice mismatch relative to the substrate 10 (e.g., silicon) on which the fins 46 are supported. In conjunction with the SiGe fins 46, the fins 44 may be composed of silicon that does not include germanium as an alloy element. In this embodiment, the fins 44 and fins 46 are epitaxially grown with asynchronous epitaxial growth process that under growth conditions selected to deposit semiconductor material of different compositions. For example, the trenches 40 may be masked when the fins 46 are formed and then formed separately after the block mask is removed. The strained channel may operate to enhance carrier mobility in the PFETs.

In an alternative embodiment, fins 46 composed of strained semiconductor material may be used in combination with a SRB functioning as the substrate 10 in order to introduce strain of different types in the channels of both the NFETs and PFETs.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
    a first layer containing a first dopant on a first region of a substrate;
    a second layer containing a second dopant on a second region of the substrate;
    a first plurality of fins each extending from the substrate through the first layer, each of the first plurality of fins including a first section in a first trench extending through the first layer, and the first section including a concentration of the first dopant;
    a second plurality of fins each extending from the substrate through the second layer, each of the second plurality of fins including a second section in a second trench extending through the second layer, and the second section including a concentration of the second dopant; and
    a spacer located between the first layer and the second layer.

2. The device structure of claim 1 further comprising:
    an undoped layer on the first layer and the second layer, wherein each of the first plurality of fins has a second section extending through the undoped layer and each of the second plurality of fins has a second section extending through the undoped layer.

3. The device structure of claim 2 wherein the second section of the first plurality of fins and the second section of the second plurality of fins projects above the undoped layer, and further comprising:
 a first gate structure that overlaps the second section of the first plurality of fins; and
 a second gate structure that overlaps the second section of the second plurality of fins.

4. The device structure of claim 1 wherein the first plurality of fins and the second plurality of fins are comprised of a semiconductor material, the first dopant has a first conductivity type in the semiconductor material, and the second dopant has a second conductivity type in the semiconductor material that is opposite to the first conductivity type.

5. The device structure of claim 1 wherein the first plurality of fins are comprised of a first semiconductor material and the second plurality of fins are comprised of a second semiconductor material different from the first semiconductor material.

6. The device structure of claim 5 wherein the first semiconductor material is silicon, the second semiconductor material is silicon-germanium, the first dopant is a p-type dopant, and the second dopant is an n-type dopant.

7. The device structure of claim 1 wherein the first layer is boron-doped silicate glass, and the second layer is phosphorus-doped silicate glass.

8. The device structure of claim 1 wherein the first layer is boron-doped silicate glass, and the second layer is arsenic-doped silicate glass.

9. A method comprising:
 forming a first layer containing a first dopant on a first region of a substrate;
 forming a spacer that is located between the first layer and the second layer;
 after forming the spacer, forming a second layer containing a second dopant on a second region of the substrate;
 forming a first plurality of fins each located in a respective trench extending from the substrate through the first layer;
 forming a second plurality of fins each located in a respective trench extending from the substrate through the second layer; and
 transferring the first dopant from the first layer to a first section in each of the first plurality of fins and the second dopant from the second layer to a second section in each of the second plurality of fins.

10. The method of claim 9 wherein forming the first layer containing the first dopant on the first region of the substrate comprises:
 depositing the first layer on the substrate;
 forming an etch mask on the first layer over the first region of the substrate; and
 removing the first layer from the second region of the substrate.

11. The method of claim 10 wherein forming the second layer containing the second dopant on the second region of the substrate comprises:
 after the first layer is removed from the second region of the substrate, depositing the second layer on the first region and the second region of the substrate; and
 removing the second layer from the first region of the substrate.

12. The method of claim 9 wherein forming the first plurality of fins each located in the respective trench extending from the substrate through the first layer comprises:
 forming a first plurality of trenches extending through the first layer; and
 epitaxially growing a first semiconductor material in each of the first plurality of trenches.

13. The method of claim 12 wherein forming the second plurality of fins each located in the respective trench extending from the substrate through the second layer comprises:
 forming a second plurality of trenches extending through the second layer; and
 epitaxially growing a second semiconductor material in each of the second plurality of trenches.

14. The method of claim 13 wherein the first semiconductor material differs in composition from the second semiconductor material, and the first semiconductor material is epitaxially grown before the second semiconductor material is epitaxially grown.

15. The method of claim 9 further comprising:
 before the first plurality of fins and the second plurality of fins are formed, forming an undoped layer on the first layer and the second layer,
 wherein each of the first plurality of fins has a second section extending through the undoped layer and each of the second plurality of fins has a second section extending through the undoped layer.

16. The method of claim 15 further comprising:
 recessing the undoped layer to at least partially reveal the second section of each of the first plurality of fins and the second section of each of the second plurality of fins;
 forming a first gate structure that overlaps the second section of each of the first plurality of fins; and
 forming a second gate structure that overlaps the second section of each of the second plurality of fins.

17. The method of claim 9 wherein transferring the first dopant from the first layer to the first section in each of the first plurality of fins and the second dopant from the second layer to the first section in each of the second plurality of fins comprises:
 thermally annealing the first plurality of fins and the second plurality of fins to prompt solid state diffusion of the first dopant from the first layer to the first section in each of the first plurality of fins and to prompt solid state diffusion of the second dopant from the second layer to the second section in each of the second plurality of fins.

18. The method of claim 9 wherein the first layer is formed by depositing a boron-doped silicate glass, and the second layer is formed by depositing a phosphorus-doped silicate glass.

19. The method of claim 9 wherein the first plurality of fins and the second plurality of fins are comprised of a semiconductor material, the first dopant has a first conductivity type in the semiconductor material, and the second dopant has a second conductivity type in the semiconductor material that is opposite to the first conductivity type.

20. The method of claim 9 wherein the first layer is formed by depositing a boron-doped silicate glass, and the second layer is formed by depositing an arsenic-doped silicate glass.

* * * * *